SEMICONDUCTOR COMPRISING PLURAL DEEP-LEVEL-FORMING IMPURITIES

Filed April 4, 1966

United States Patent Office 3,448,350

Patented June 3, 1969

3,448,350

SEMICONDUCTOR COMPRISING PLURAL DEEP-LEVEL-FORMING IMPURITIES

Akio Yamashita, Ikeda-shi, and Masaru Tanaka, Toyonaka-shi, Japan, assignors to Matsushita Electric Industrial Co. Ltd., Kadoma-shi, Osaka, Japan, a corporation of Japan Filed Apr. 4, 1966, Ser. No. 539,878

Claims priority, application Japan, Apr. 7, 1965, 40/20,945

Int. Cl. H01l 3/16, 5/02

U.S. Cl. 317—234 11 Claims

ABSTRACT OF THE DISCLOSURE

A semiconductor device comprising a body of semiconductor material such as a III–V compound, Si or Ge doped with at least two deep-level-forming impurities selected from the group consisting of Au, Fe, Co, Zn, Mn, Cu, and Ni is disclosed. At least two electrodes are provided to the semiconductor body. The body may have additional regions of p. n. p+ and n+ conductivity formed therein.

The present invention relates to semiconductor devices, and more particularly to semiconductor devices having negative resistance characteristics.

Recently, attention is beginning to be paid to a double injection diode, which is a semiconductor device having negative resistance. This double injection diode has the structure of p-i-n. The i region is a region which is doped with a deep-level impurity, and p and n regions are well known regions which have p-type and n-type conduction, respectively.

When a voltage is applied to such a diode in the forward direction, electrons and holes are concurrently injected into the i region. If the injection level of the electrons and holes is low, however, a current barely flows due to the recombination of the electrons and the holes caused by the fact that the deep impurity levels existing in the i region act as recombination centers. If the injection level becomes higher, the electrons and holes drift through the i region without recombining, and contribute to the current. As a result, a high resistance of the i region changes to a low resistance to realize a negative reistance. Heretofore, a semiconductor substrate has been doped with only one kind of impurity such as Au, Fe, Co, Zn, Mn, Cu, Ni, or the like in order to form such an i region. However, according to the inventors' attentive experiment, it was found that successful negative resistance could not be obtained by doping with only one kind of impurity as was practiced in the past.

It is an object of the invention to provide a semiconductor device having a negative resistance useful for switching elements.

According to the present invention, there is provided a semiconductor device characterized in that a semiconductor substrate doped with at least two kinds of impurities each forming a deep level or levels therein is provided with at least two electric connections.

Other objects, features and advantages of the present invention will become more apparent from the following detailed description of the invention when taken in conjunction with the accompanying drawings, in which.

Figure 1:
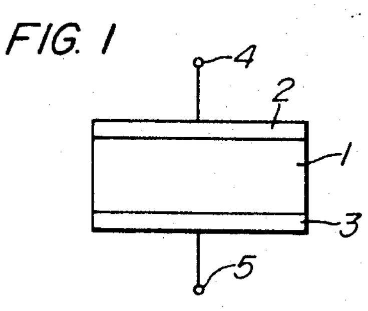
FIG. 1 is a schematic sectional view of an embodiment of the invention.

If a semiconductor such as Si, Ge, GaAs, GaP, GaSb or the like is doped with at least two kinds of impurities each forming a deep level or levels therein such as Au, Co, Cu, Ni, Fe, Zn, Mn or the like, multi-levels are formed in the forbidden band of the semiconductor. By attaching two metal electrodes to a body of semiconductor having such multi-levels, a simplest form of semiconductor device according to the present invention is obtained, the construction thereof being shown schematically in FIG. 1. To metal electrodes 2 and 3 of a body of semiconductor 1, doped with at least two kinds of deep-level-forming impurities and having multi-levels, lead wires 4 and 5 are attached, respectively. Although the characteristics of such devices are different according to the kinds of semiconductor substrates, dopants and electrode metals, negative resistance is obtained in all cases.

Figures 2, 3:
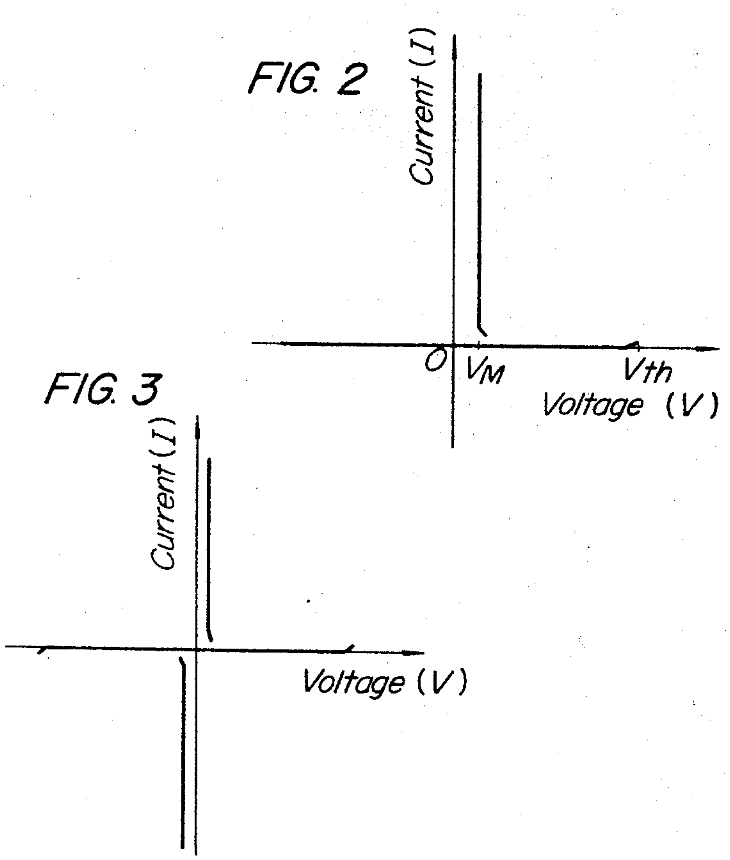
FIGS. 2 and 3 are voltage vs. current characteristics of semiconductor devices according to the invention.

The cause of the negative resistance is assumed to be an avalanche due to electrons injected with a high injection level. The ground of the assumption is the fact that the threshold voltage of the negative resistance characteristic becomes higher as the temperature rises. A voltage (V) vs. current (I) characteristic of such a semiconductor device is shown in FIG. 2. The characteristic feature of the negative resistance of the inventive device is that the rise of current at the "ON" state is excellent, the curve exending to a sufficiently low value, and the jump of the negative resistance region is abrupt. The negative resistance of a conventional p-i-n diode has been such that the threshold voltage thereof lowers as the temperature rises, and the jump of the negative resistance is gradual.

The symmetrical provision of two like electrodes to an i region having the multi-levels of the invention gives rise to a bilateral negative resistance. Further, the same structure as a conventional p-i-n diode gives rise to a steeper negative resistance similar to that shown in FIG. 2 than that according to conventional double injection. Or again, so long as the negative resistance is resulting from the avalanche, the bilateral negative resistance characteristics can be obtained even in n-i-n and p-i-p structures. In addition, the negative resistance characteristics can be controlled by providing additional electrical contact to the i region.

Now, examples of the device according to the invention will be described hereinbelow.

(1) A Si substrate was doped with Au and Co by a known method. Two Ag electrodes were attached to thus treated substrate to form a diode. By observing the V–I characteristics thereof, it was proved that the bilateral negative resistance characteristics shown in FIG. 3 had been obtained.

(2) A GaAs substrate was doped with Cu and Mn. One surface of the substrate was formed into a degenerate $p^+$ region by diffusing Mn thereinto, with which region Sn was alloyed. The opposite surface was alloyed with Sn to form an $n^+$ region. The V–I characteristic of thus formed $p^+$-i-$n^+$ diode showed a unilateral negative resistance as shown in FIG. 2. This negative resistance is considered to be caused by double injection.

(3) Ge was doped with Cu and Fe to form the structure of $p^+$-n-i-$n^+$ by a known method. In this diode too, a V–I characteristic as shown in FIG. 2 was observed, and the threshold voltage $V_{th}$ thereof was very large, such as 200 v. or more.

Although some examples of the semiconductor device of the invention have been described hereinabove, it is apparent to those skilled in the art that other various changes and modifications may be made. In any case, as far as a semiconductor doped with two or more kinds of impurities forming deep levels therein is used, a favourable negative resistance characteristic can be obtained, and there exist wide applications such as, for example, switching elements and controllable rectifiers.

What we claim is:

1. A semiconductor device having a negative resistance characteristic comprising a body of semiconductor material doped with at least two deep-level-forming impurities selected from the group consisting of Au, Fe, Co, Zn, Mn, Cu, and Ni, and at least two electrodes provided to said semiconductor body.

2. A semiconductor device according to claim 1, wherein the body is formed of Si and the two deep-level-forming impurities are Au and Co.

3. A semiconductor device according to claim 1, wherein the body is formed of Ge and the two deep-level-forming impurities are Cu and Fe.

4. A semiconductor device according to claim 1, wherein the body is formed of a III–V compound.

5. A semiconductor device according to claim 1, wherein the body is formed of GaAs and the two impurities are Cu and Mn.

6. A semiconductor device according to claim 1, wherein three electrodes are provided to said semiconductor body.

7. A semiconductor device according to claim 1, wherein the device is an n-i-n structure.

8. A semiconductor device according to claim 1, wherein the device is a p-i-p structure.

9. A semiconductor device according to claim 1, wherein the device is a $p^+$-i-$n^+$ structure.

10. A semiconductor device according to claim 1, wherein the device is a $p^+$-n-i-$n^+$ structure.

11. A semiconductor device according to claim 1, wherein a portion of said body is of i type due to the doping with said two deep-level-forming impurities and at least two additional regions of selected conductivity are formed in said semiconductive body.

References Cited

UNITED STATES PATENTS

| | | |
|---|---|---|
| 3,132,408 | 5/1964 | Pell. |
| 3,152,024 | 10/1964 | Diedrich. |
| 3,287,611 | 11/1966 | Bockemuehl et al. |

JAMES D. KALLAM, *Primary Examiner.*

U.S. Cl. X.R.

317—237